US006426633B1

United States Patent
Thybo

(10) Patent No.: US 6,426,633 B1
(45) Date of Patent: Jul. 30, 2002

(54) METHOD FOR MONITORING A ROTATIONAL ANGLE SENSOR ON AN ELECTRICAL MACHINE

(75) Inventor: Claus Thybo, Sønderborg (DK)

(73) Assignee: Danfoss Drives A/S, Graatsen (DK)

( * ) Notice: Subject to any disclaimer, the term of this patent is extended or adjusted under 35 U.S.C. 154(b) by 115 days.

(21) Appl. No.: 09/593,408

(22) Filed: Jun. 14, 2000

(30) Foreign Application Priority Data

Jun. 18, 1999 (DE) .......................................... 199 27 851

(51) Int. Cl.[7] .............................................. G01R 31/00
(52) U.S. Cl. ....................... 324/511; 324/537; 324/158.1
(58) Field of Search ................................. 324/537, 545, 324/163, 167, 162, 160, 158.1, 511, 510

(56) References Cited

U.S. PATENT DOCUMENTS 5,239,490 A * 8/1993 Masaki et al. ........... 324/163 X
5,365,787 A * 11/1994 Hernandez et al. ..... 324/226 X
5,691,611 A * 11/1997 Kojima et al. ............... 318/254
6,084,400 A * 7/2000 Steinich et al. ......... 324/207.13
6,084,416 A * 7/2000 Kishimoto ................... 324/644

* cited by examiner

Primary Examiner—N. Le
Assistant Examiner—T. R. Sundaram
(74) Attorney, Agent, or Firm—Lee, Mann, Smith, McWilliams, Sweeney & Ohlson

(57) ABSTRACT

A method for monitoring a rotational angle sensor on an electrical machine. It is desired to provide a method that enables fault detection at both high speeds and low speeds of the rotor. The electrical power of the machine is measured and a power value is estimated using the output signal of the rotational angle sensor, a residual being formed from the measured power and the estimated power and the time curve of the residual being monitored.

8 Claims, 3 Drawing Sheets

METHOD FOR MONITORING A ROTATIONAL ANGLE SENSOR ON AN ELECTRICAL MACHINE

BACKGROUND OF THE INVENTION

The invention relates to a method for monitoring a rotational angle sensor on an electrical machine.

The invention will be described hereinafter with reference to a motor as an example of an electrical machine, but is not limited thereto. The problems with a rotational angle sensor can arise also in machines operated as generators and are solved in corresponding manner.

In order to be able to operate electromotors with a higher dynamic and greater precision, it is often necessary to know the angular position or rotational position of the rotor relative to the stator. This is especially the case with induction machines that are supplied by a converter. In order to obtain that information, a rotational angle sensor is used, which is coupled to the motor shaft. Such a rotational angle sensor is also known by the name "Resolver" or "Encoder". It may operate in various ways. In some instances it is not the angle of rotation but the angular speed that is measured and integrated. The crucial factor is, however, that it is possible either directly or indirectly, for example by integration, to determine the angular position of the rotor relative to the stator. The information relating to the angle or to the speed is supplied to the frequency converter or to another electronic motor control system and is used to control the speed and/or the torque.

If the rotational angle sensor fails for any reason, the electronic motor control system receives either no signal at all or a false signal. "Failure" is to be understood as any circumstance in which the correct rotational angle signal does not reach the motor control system. It may be, for example, an interruption in the signal transmission between the rotational angle sensor and the motor control system. When the motor control system does not receive the correct signal, this results in incorrect behaviour during operation. For example, when customary V-F regulation with rotational speed feedback is being used, the motor control system drives the speed of the motor to its maximum when the signal transmission is interrupted. Clearly such operating conditions are undesirable.

In the prior art, a number of methods are known for detecting or identifying such fault situations in conjunction with the rotational angle sensor, so as to be able subsequently to take measures to correct the fault. For example, redundancy can be incorporated into the rotational angle sensor, that is to say a second rotational angle sensor can be provided and the results of the two rotational angle sensors can be compared with one another. The functioning of the rotational angle sensor can also be monitored by means of integrated monitoring electronics. Another type of monitoring consists of using certain parameters of the motor or of the motor control system in the monitoring process. The present invention is of the latter type.

From U.S. Pat. No. 5,691,611 a method for monitoring a rotational angle sensor is known in which an average speed of the motor is calculated. That speed is compared with the instantaneous value of the speed detected by the rotational angle sensor. An absolute difference is formed from those two values. Should that difference be greater than a limit value, it is assumed that the rotational angle sensor is not functioning correctly.

That method works well at relatively high speeds. The detection of faults becomes critical, however, in the range of very low speeds, for example in the range of from 0 to 100 rev/min. That range also includes the particularly critical situation of a speed of 0 rev/min. When such a speed is indicated, it is necessary to be able to detect whether or not the rotor is actually stationary, for example whether or not it is blocked, or whether or not the rotational angle sensor is defective, for example signal transmission has been broken off or interrupted in some other way.

The problem underlying the invention is to provide a method for monitoring a rotational angle sensor on an electrical machine that enables fault detection over a large speed range.

SUMMARY OF THE INVENTION

That problem is solved in a method of the type mentioned at the beginning in that the electrical power of the machine is measured and a power value is estimated using the output signal of the rotational angle sensor, a residual being formed from the measured power and the estimated power and the time curve of the residual being monitored.

By proceeding in this way it is possible to carry out fault detection also at low speeds and even at extremely low speeds. A blockage of the rotor is also detected, that is to say fault detection can be carried out even at a speed of 0. The fault detection is, moreover, substantially faster. The same method can be used over the entire speed range. This method also enables a relatively good ratio of signal to interference (signal/noise ratio) to be obtained. The method is also relatively robust because it is dependent upon parameters in the motor model that exhibit little sensitivity to influences causing disturbance. In the simplest case, the residual is formed from the difference between the measured power and the estimated power. When the time curves of the measured power and of the estimated power vary, the time curve of the difference is also not constant. That difference, hereinafter referred to as the residual, can be used to check the functioning of the rotational angle sensor. The electrical power can be measured with relatively little complication, generally from the product of the current and voltage. The estimated power is calculated in part from values that are determined by measurement, for example currents or indeed the speed, and also from parameters of the machine, for example inductance or the like. Where there are no faults, the two powers, that is to say the measured power and the estimated or calculated power, should correspond to one another. Should the rotational angle sensor or its output transmission be disrupted, the part of the estimated power based on that signal, that is to say on the speed or the angle of rotation, will necessarily change. This results in a difference, or a residual, between the measured power and the estimated power, indicating a fault. That procedure also functions when the rotor is stationary because, for example, it is blocked. In that case the electrical power consumed by the machine can be measured. That power is, however, pure power loss because no mechanical work is done. In an appropriately selected machine model, the same value will result for the estimated power also. Since the speed signal is zero, here again it should only be a question of power loss components. The situation is different when the rotational angle sensor is defective and indicates a speed of zero even though the rotor is in fact rotating. In that case, the measured electrical power is higher by the amount produced mechanically at the rotor shaft. When the rotor is blocked, in many cases it is not completely stationary but will rotate a little bit. Even that small amount of rotation is enough to be able to check whether or not the rotational angle sensor is functioning, since both the measured power and the estimated power increase to the same extent. The result is that when there are no faults the residual remains zero.

Preferably an error threshold is specified and it is assumed that there is an error in the output signal when the residual exceeds the error threshold. This is a quasi-static procedure. Relatively small differences between the measured power and the estimated power cannot be avoided during operation, especially when there are changes in speed. These are not critical, however, provided they do not exceed a certain value. If such a value is exceeded, it is assumed that there is a fault.

In an alternative or additional embodiment, it can be assumed that there is a fault when the increase in the residual over time exceeds a predetermined limit value. When the change in the difference between the measured power and the estimated power becomes too large, it is generally a clear indication that a fault is present.

Preferably the estimated power is discarded within a predetermined period after the error threshold has been exceeded. It can be observed, for example, that the curve of the residual in some cases initially rises and once a maximum has been reached falls again, namely below the zero value. This is caused, inter alia, by the fact that, for example in a control system based on the feedback of the rotational angle, the current is calculated incorrectly. The incorrectly calculated current is also used, however, in the calculation of the estimated power, with the result that a still greater error can occur there. In order to prevent a fault-free state from being detected by mistake when the zero line is crossed, the estimated power is discarded within a predetermined period of time. The machine will preferably still be halted or switched to a different controlling or regulating procedure that no longer requires the feedback of the angle signal.

Accordingly, when a fault occurs, the output signal of the rotational angle sensor is preferably no longer used to control the machine, so avoiding further errors.

Preferably the estimated power is formed by a load part, a rotor loss part, a stator loss part and a magnetizing part. That model reproduces the electrical power consumption with sufficient accuracy and can accordingly be used to form the residual.

In that instance, it is especially preferable that the output signal of the rotational angle sensor enter only into the load part. This facilitates the calculation. A clear separation can be made between the signals. The calculation is also simplified.

Preferably the machine is shut down gently after a fault occurs. In other words, the machine is not braked abruptly, which could result in further damage, but is run down slowly. Alternatively, it is possible to switch to a safety operating mode in which the power capacity is reduced.

BRIEF DESCRIPTION OF THE DRAWINGS

The invention will be described hereinafter in greater detail with reference to a preferred embodiment, in conjunction with the drawings, in which.

DETAILED DESCRIPTION OF THE INVENTION

Figure 1:
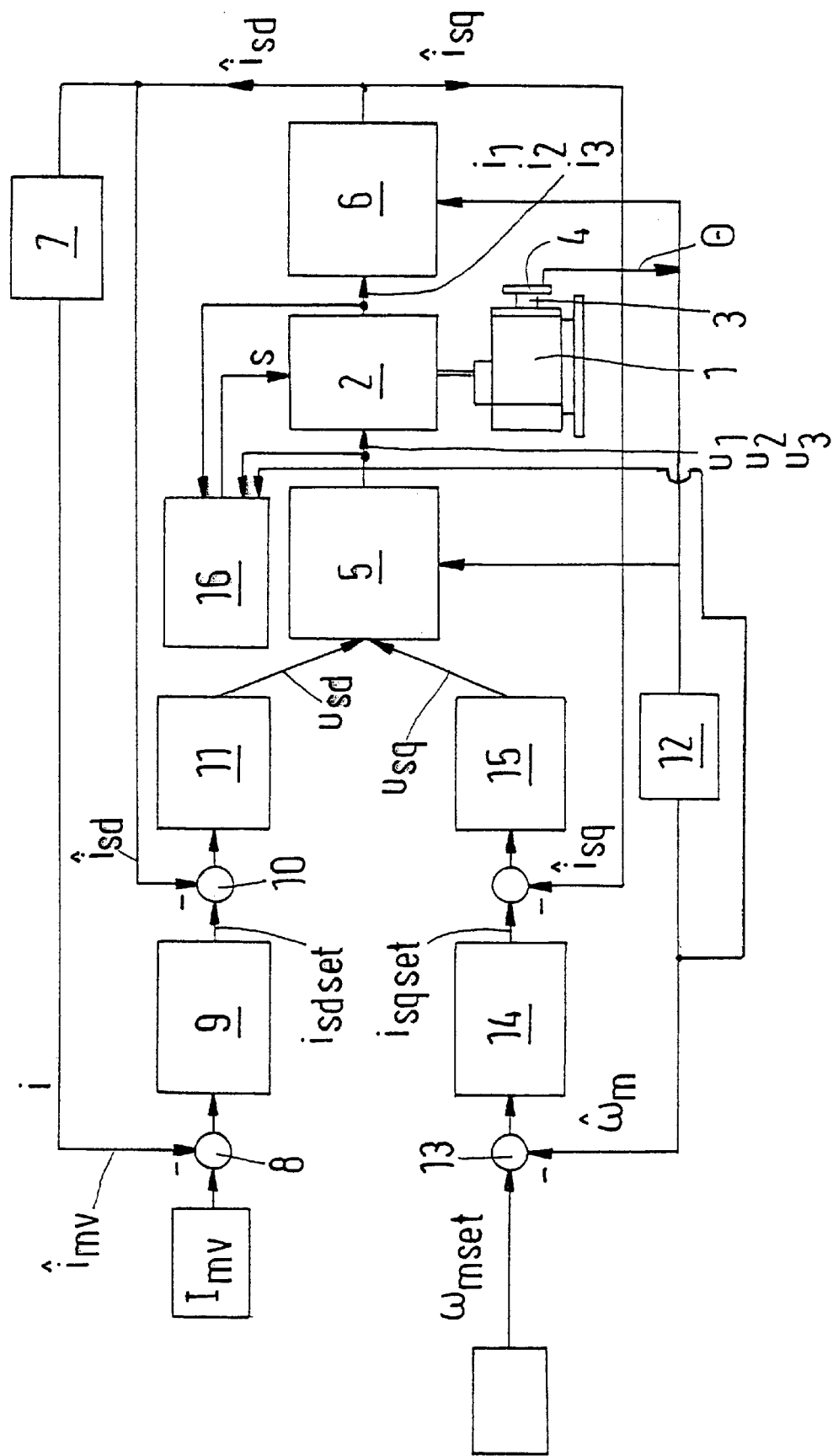
FIG. 1 is a diagrammatic representation of a circuit arrangement for monitoring a rotational angle sensor.

FIG. 1 shows a three-phase induction motor 1, which is controlled by an inverter 2. A rotational angle sensor 4 (shown only diagrammatically) is provided at the output shaft 3 of the motor 1. The frequency converter 2 receives its input signals $u_1, u_2, u_3$ from a 2-3-transformation means 5, which transforms input signals $u_{sd}, u_{sq}$ from a two-axis system to a three-axis system. The inverter in turn sends output signals $i_1, i_2, i_3$ to a 3-2-transformation means 6, which transforms those signals from a three-axis system to signals $\hat{i}_{sd}, \hat{i}_{sq}$, the latter signals in turn relating to a two-axis system of co-ordinates. When, hereinafter, values are provided with a ^, this means that they are measurable values or values that have been derived therefrom, the value of which may be influenced by a fault. Other values may be pure calculated values.

The signal $\hat{i}_{sd}$ is forwarded to a magnetizing current calculating device 7, which calculates a magnetizing current $\hat{i}_{mr}$ and forwards this to a subtraction input of a summing point 8. A predetermined reference value for the magnetizing current $I_{mr}$ is forwarded to the other, summing input of that summing point 8. The difference between those two magnetizing currents is forwarded to a magnetizing current regulator 9, at the output of which a signal $i_{sdset}$ is emitted. At a further summing point 10, the difference between the values $i_{sdset}$ and $\hat{i}_{sd}$ is formed and forwarded to an $i_{sd}$ monitor 11, which forms the input signal $u_{sd}$. Put simply, the voltage usd is responsible for the magnetization and relates to the direct axis (d-axis).

The output signal of the rotational angle sensor 4 is forwarded to a differentiator 12, at the output of which an angular speed $\hat{\omega}_m$ is produced which is forwarded to the negative input of a summing point 13. A speed reference signal $\omega_{set}$ is forwarded to the summing point 13. The output of the summing point 13 is forwarded to a speed monitor 14, at the output of which the value $i_{sqset}$ is emitted. That value has substracted from it an output value from the 3-2-transformation means 6, namely the value $\hat{i}_{sq}$, and the result is forwarded to an $i_{sq}$ monitor, at the output of which the voltage $u_{sq}$ is produced, which is in turn forwarded to the 2-3-transformation means 5. Put simply, the voltage $u_{sq}$ is responsible for the moment and relates to the quadrature axis (q-axis).

It will be noted that the angle of rotation θ is forwarded not only to the differentiator 12, but also to both the 2-3- and 3-2-transformation means 5, 6. The differentiated angle of rotation signal θ, that is to say the signal $\hat{\omega}(t)$, is also forwarded to a monitoring device 16. That monitoring device 16 also contains the output signals $u_1, u_2, u_3$ of the 2-3-transformation means 5 and the input signals $i_1, i_2, i_3$ of the 3-2-transformation means 6.

Instead of the field-oriented regulation shown, it would also be possible to use customary voltage-frequency regulation (V-F-regulation).

The power at the motor 1 is determined using customary multiplication of the currents and voltages occurring at the windings and can thus be regarded as measured power.

$$P_{total}(t) = \frac{2}{3}\langle \vec{u}_s(t)\vec{i}_s(t)\rangle \quad (1)$$

In known manner the equation (1) can be converted to a two-axis stator-oriented system of co-ordinates, in which usa describes the real part and Usb describes the imaginary part:

$$P_{total}(t) = \frac{2}{3}(u_{sa}(t)i_{sa}(t) + u_{sb}(t)i_{sb}(t)) \quad (2)$$

Using an angle of transformation ρ, equation (2) can also be transformed into a rotor current-oriented system of co-ordinates, in which $i_{sd}$ and $i_{sq}$ describe the real part and the imaginary part, respectively, of the stator current:

$$P_{total}(t) = \frac{2}{3}(u_{sd}(t)i_{sd}(t) + u_{sq}(t)i_{sq}(t)) \quad (3)$$

Those values are found also in the diagrammatic representation of FIG. 1.

The power $P_{total}(t)$ represents the power actually consumed by the motor 1.

Using a motor model, it is then possible to calculate or estimate a power $P_{est}(t)$ $$P_{est}(t) = \hat{P}_{load}(t) + P_{rotorloss}(t) + P_{statorloss}(t) + P_{mag.}(t) \quad (4)$$

The terms of equation (4) can be expressed as follows:

$$P_{load}(t) = \frac{2}{3} \frac{L_h}{1+\sigma_r} Z_p \omega_m(t) i_{mr}(t) i_{sq}(t) \quad (5)$$

$$P_{rotorloss}(t) = \frac{2}{3} \frac{R_r}{(1+\sigma_r)^2} i_{sq}^2(t) \quad (6)$$

$$P_{statorloss}(t) = \frac{2}{3} R_s (i_{sa}^2(t) + i_{sb}^2(t)) \quad (7)$$

$$P_{statorloss}(t) = \frac{2}{3} R_s (i_{sd}^2(t) + i_{sq}^2(t)) \quad (8)$$

$$P_{mag.}(t) = \frac{2}{3}\left(\sigma_s L_s \left(\frac{di_{sd}}{dt} i_{sd}(t) + \frac{di_{sq}}{dt} i_{sq}(t)\right) + \frac{L_h}{1+\sigma_r} \frac{di_{mr}}{dt} i_{sd}(t)\right) \quad (9)$$

Equation (5) shows the load part, equation (6) shows the rotor loss part, equations (7) and (8) show the stator loss part (relative to the stator system) and equation (9) shows the magnetizing loss part. $\sigma_r$ and $\sigma_s$ indicate the rotor and stator stray inductances, respectively. $R_r$ and $R_s$ describe the rotor and stator resistances, respectively. $L_s$ is the static inductance, $L_h$ is the static main inductance. Equation (9) accordingly basically describes the energy stored in the inductances.

The angular speed $\omega_m(t)$ in equation (5) is an angular speed that is continuously updated by the differentiator 12. This means that $P_{load}=0$ when $\omega_m=0$.

Assuming that no position signal or angular speed signal comes from the differentiator 12. This may mean either that the rotor is fully braked because, for example, it is blocked, or that the angle of rotation transmitter 4 or the differentiator 12 is defective. In order to distinguish therebetween, the power $P_{total}$ to the motor can now be measured and compared with the estimated power $P_{est}$.

Subtraction of the estimated power $P_{est}$ from the measured power $P_{total}$ gives a power residual $r_l$. That power residual $r_l$ can then be monitored in the monitoring device 16 and a diagnosis of the rotational angle sensor can be made.

$$r_l(t) = P_{total}(t) - (\hat{P}_{load}(t) + P_{rotorloss}(t) + P_{statorloss}(t) + P_{mag.}(t)) \quad (10)$$

$$r_l(t) = \begin{cases} 0 & \text{when } \hat{\omega}_m(t) = \omega_{cm} \\ \frac{2}{3} \frac{L_h}{1+\sigma_r} Z_p \omega_m(t) i_{mr}(t) i_{sq}(t) & \text{when } \hat{\omega}_m(t) = 0 \end{cases} \quad (11)$$

Equation (11) describes the amplitude of $r_l$ shortly after the measured signal $\hat{\omega}_m$ disappears, that is to say falls to the value zero. Thereafter, $r_l$ changes its value because an incorrect rotational angle signal θ or an incorrect angular speed signal $\hat{\omega}(t)$ is forwarded to the two transformation means 5,6 and also to the monitoring device 16.

As long as the monitoring device 16 registers a power residual $r_l$ of value zero, however, it can be assumed that the rotational angle sensor 4, 12 is operating correctly.

In the opposite case, that is to say when the rotational angle sensor 4 or the differentiator 12 are defective or the signal transmission is interrupted, that is to say when $\hat{\omega}_m(t)$, that is to say the signal value, is zero but the rotor is still actually rotating, electrical power is still required for the motor shaft. In that case, the measured power $p_{total}$ has not changed.

The estimated power, however, has become smaller by the amount $P_{load}$ since the estimated $P_{load}$ is proportional to $\hat{\omega}_m(t)$ and that value is now zero. It should be noted that, in the present case, $\hat{\omega}_m$ is used only for the load part $P_{load}$. This facilitates the evaluation.

In the case of the fault under consideration, the power residual $r_l$ is greater than zero. It is thus possible to establish that the angular speed and also the angle of rotation indicated are not correct. Some one of the rotational angle sensor 4, differentiator 12 or transmission elements is defective.

The monitoring device 16 has stored the required motor parameters, for example $L_h$, and, on the basis of the stator voltage data $u_{s1-3}$, and of the measured values of the stator currents $i_{s1-3}$, calculates the values of the equations mentioned. It monitors $r_l$. As soon as the rotational angle detection becomes incapable of functioning, the appropriate measure is introduced at the output S, for example the inverter 2 is switched off.

Preferably the inverter will, however, be gently downwardly adjusted, that is to say the motor will not be braked abruptly, but can be run down in a controlled manner.

When the rotational angle sensor and the units connected thereto are functioning correctly, but the rotor is stationary, the absolute values of $P_{total}$ and $P_{est}$ increase, since $i_{sq}$ and thus the motor current rise as a result of the blocked rotor. Since, however, both values $P_{total}$ and $P_{est}$ increase proportionally, the difference, that is to say the power residual $r_l$ is still zero. The rotational angle sensing remains operative.

The method can also be used when the rotational angle sensor 4 is not completely incapable of functioning but is, for example, functioning only intermittently. This may be the case where apertures in an optical sensor are partially obscured or soiled. Even in the case of a false $\hat{\omega}_m$ the power residual $r_l$ will be other than zero. Incorrect functioning of the rotational angle sensor can thus be indicated.

Figure 2:
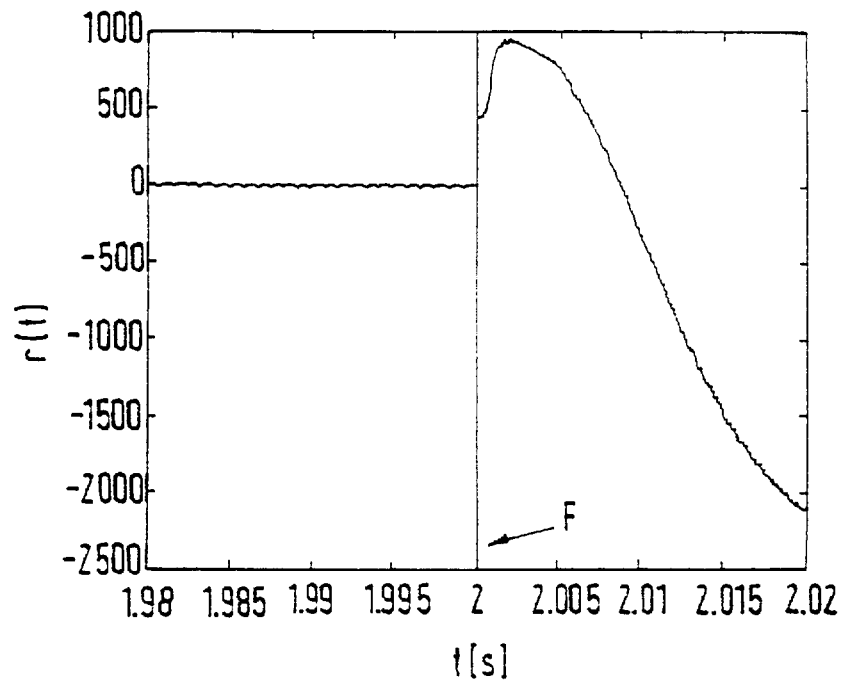
FIG. 2 shows the curve of a residual in a first operating state.

FIG. 2 shows the curve of the residual $r_l$ for high speeds, namely for 100 rad per second. It can be seen that up to time t=2 s the residual $r_l$ hovers around the value zero. A small amount of ripple is unavoidable. At time t=2 s a fault F occurs, for example transmission is broken off. After just 3/1000 sec., the power residual is clearly other than zero, so making fault detection easily possible.

Figure 3:
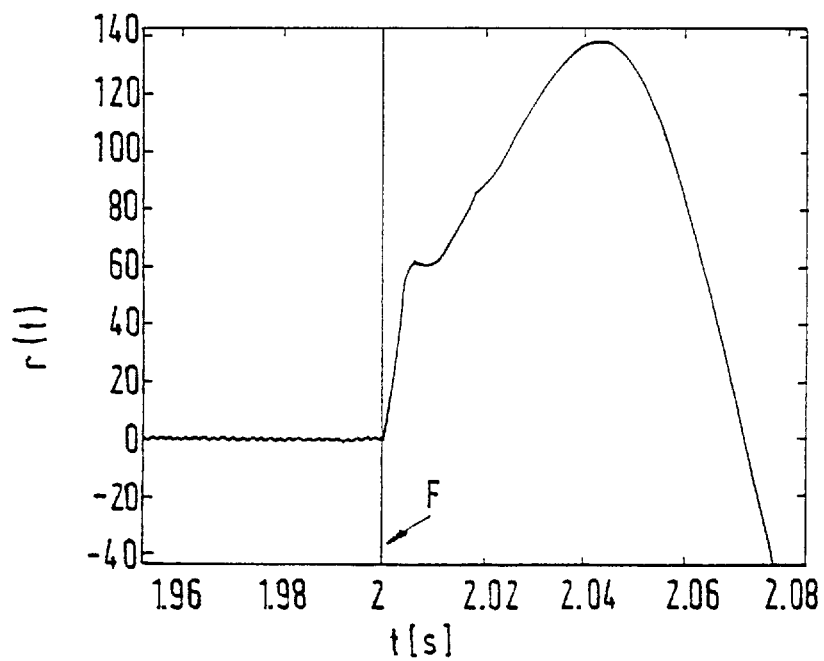
FIG. 3 shows the curve of a residual in a second operating state.

What is normally more difficult, however, is to detect such a fault at low speeds, for example at 5 rad/s. As can be seen with reference to FIG. 3, the power residual $r_l$ exhibits clear behaviour here also. Compared with the rise in $r_l$ at the interruption F at 100 rad/s, here the rise is slower. Fault detection is possible here also after just $1/100$ s or at the latest after $4/100$ s. Compared with the state of the art, those times are substantially shorter.

The behaviour of $r_l$ over time can be attributed to the angle of transformation $\hat{\rho}$ and the moment current $i_{sq}$. $\hat{\rho}$ expresses the electrical angle between the rotor current-oriented system of co-ordinates and the stator current-oriented system of co-ordinates and can be expressed in known manner as follows:

$$\hat{\rho}(t) = \int \left( \frac{\hat{i}_{sq}(t)\hat{i}_{mr}(t)}{tr} + \hat{\omega}_m(t)Z_p \right) dt \quad (12)$$

where tr is a rotor time constant and $Z_p$ corresponds to the number of pole pairs in the stator. The first term here corresponds to the slip of the motor and the second term corresponds to the shaft speed, calculated in electrical co-ordinates. If the rotational angle sensing fails completely, the second term becomes zero. The angle of transformation thus becomes incorrect. That is also the case where there are soiled apertures or masks in the rotational angle sensor 4. The second term then differs from the correct value.

Figure 4:
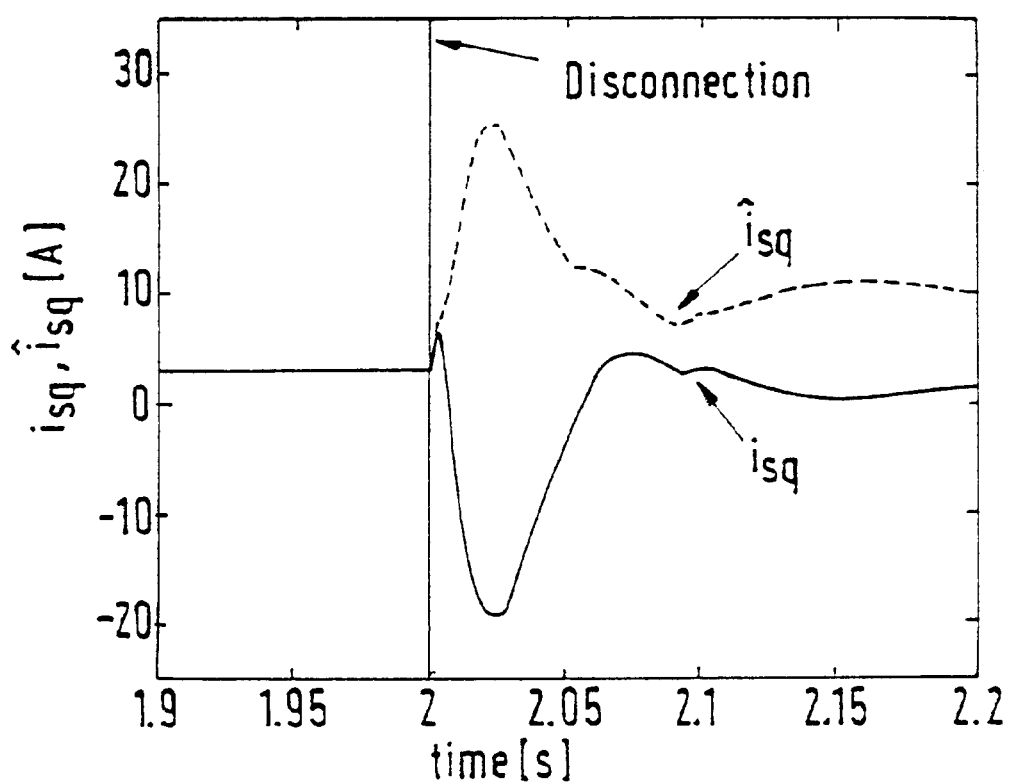
FIG. 4 shows various current curves.

When the angle of transformation $\hat{\rho}$ in equation (12) becomes incorrect, that means that the transformations in the transformation means 5, 6 (FIG. 1) will also be incorrect, resulting, inter alia, in an incorrect widely varying value of $i_{sq}$. That can be seen, for example, in FIG. 4, where the "true" value of $i_{sq}$ is plotted in a continuous line, whilst the estimated value $\hat{i}_{sq}$ is plotted in a broken line. After $3/100$ s, $i_{sq}$ has an amplitude of almost −20 amperes.

Besides $i_{sq}$, also present in all terms of equations (5) to (9) are $i_{mr}$ and $i_{sd}$. They thus also have a strong influence upon $r_l$.

In FIG. 2, $r_l$ rises rapidly to up to approximately 400 W, which is caused by the term $P_{load}$, which immediately becomes zero. $r_l$ rises further to 950 W and then falls continuously to a value of −2000 W. This corresponds approximately to the time of amplitude −20 A in FIG. 4. In order to avoid the incorrect assumption, when $r_l$ passes through zero again, that everything is functioning correctly again, care will be taken to ensure that immediately after a fault has occurred all subsquent values will be discarded.

Preferably a change in the power residual $r_l$ will be detected even before the maximum. That detection can be effected either when a limit value is exceeded or when there is too great a rise in the $r_l$ curve.

The method is relatively robust in respect of the ratio between the power residual and faults. It is sensitive to only relatively few parameters in the motor model ($L_h$, $L_s$, $\sigma_s$, $\sigma_r$, $R_r$, $R_s$) in equations (5) to (9), and in respect of step responses simulations have shown that, with a step from 100 rad/s to 5 rad/s in 1.9 s, the power residual $r_l$ will return to zero.

What is claimed is:

1. Method for monitoring a rotational angle sensor on an electrical machine, comprising the steps of measuring the electrical power of the machine, estimating a power value using an output signal of the rotational angle sensor, forming a power residual from the measured electrical power and the estimated power value, and monitoring a time curve of the power residual.

2. Method according to claim 1, in which an error threshold is specified and an error is assumed in the output signal when the power residual exceeds the error threshold.

3. Method according to claim 2, including the further step of discarding the estimated power valve within a predetermined period after the error threshold has been exceeded.

4. Method according to claim 1, in which a fault is assumed when an increase in the power residual over time exceeds a predetermined limit value.

5. Method according to claim 1, in which when a fault occurs, the output signal of the rotational angle sensor is not used to control the electrical machine.

6. Method according to claim 1, in which the estimated power value is formed by a load part, a rotor loss part, a stator loss part and a magnetizing part.

7. Method according to claim 6, in which the output signal of the rotational angle sensor enters only into the load part.

8. Method according to claim 1, including, in the event of a fault, the further step of shutting the machine down gently after a fault occurs.

* * * * *